(12) United States Patent
Zini et al.

(10) Patent No.: US 7,043,029 B1
(45) Date of Patent: May 9, 2006

(54) DEVICE FOR USE IN AN AUDIO SIGNAL PROCESSING SYSTEM

(76) Inventors: Sergio Luca Zini, 40134 Via Montefiorino 3, Bologna (IT); Ruggero Ruggeri, 40138 Via Luigi Riccoboni, 5, Bologna (IT)

( * ) Notice: Subject to any disclaimer, the term of this patent is extended or adjusted under 35 U.S.C. 154(b) by 0 days.

(21) Appl. No.: 09/470,193

(22) Filed: Dec. 21, 1999

(30) Foreign Application Priority Data

Dec. 22, 1998 (IT) ............................ TO98A1069

(51) Int. Cl.
*H03B 29/00* (2006.01)

(52) U.S. Cl. ..................................... 381/71.7; 381/71.3

(58) Field of Classification Search .............. 381/71.1, 381/71.3; 360/97.01, 97.02; 310/334, 326
See application file for complete search history.

(56) References Cited

U.S. PATENT DOCUMENTS 5,781,373 A * 7/1998 Larson et al. ............ 360/97.02

* cited by examiner

*Primary Examiner*—Brian T. Pendleton
(74) *Attorney, Agent, or Firm*—Conley Rose, P.C.

(57) ABSTRACT

A device for use in an audio signal processing system, the device having at least one operating member for processing an audio signal; and a vibration transmission circuit connected to the operating member to distribute undesired vibration in controlled manner.

19 Claims, 4 Drawing Sheets

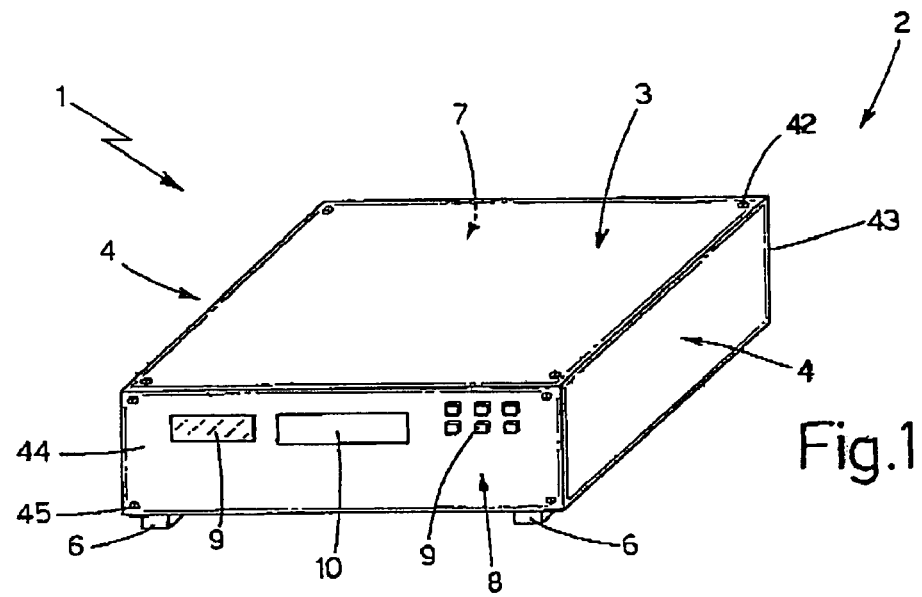
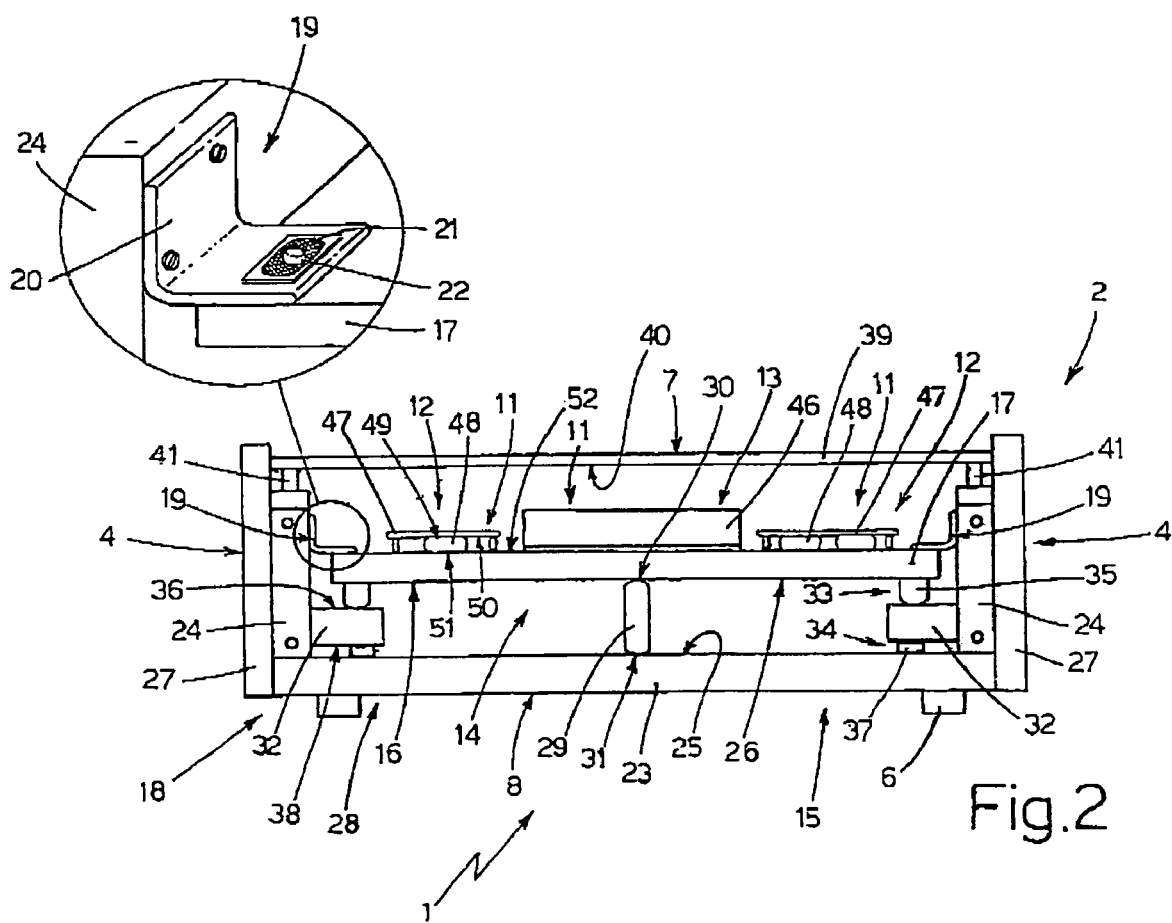
Fig.1
Fig.2

DEVICE FOR USE IN AN AUDIO SIGNAL PROCESSING SYSTEM

The present invention relates to a device for use in an audio signal processing system.

BACKGROUND OF THE INVENTION

All audio system operating members are subject to undesired vibration, which is extraneous to, and tends to distort and impair the final quality of, the original musical message. Such vibration is caused by stress generated in the audio system operating members, any one of which is substantially an energy source of some sort (electrical or mechanical) which releases vibration in the form of synchronous and asynchronous, undulating and pulsating mechanical stress, which tends to remain active for a certain length of time, and hence out of sync with the original audio signal, before diminishing naturally and in uncontrolled (random) manner. Persistent spurious vibration diminishing in uncontrolled manner in its own time is normally referred to as "stationary vibration."

The above audio system operating members are normally divided into mechanical, electronic, acoustic transducing and transmission members.

In other words, the aforementioned stress is generated by vibrating or oscillating components capable of releasing oscillating energy in the form of mechanical stress or vibration not only in the audio band but also at subsonic and ultrasonic frequencies, and is generated by electronic printed circuit components, cables and wiring capable of producing undulating-pulsating magnetic and electrical fields when supplied with the audio (or power) signal and so releasing oscillating energy in the form of sonic-frequency, i.e. audible, microvibrations.

Steps currently taken to compress undesired vibration in audio equipment still fail to provide for optimum sound quality. This is due to the fact that, though compressible, and no matter how accurately it is compressed, such vibration and its effect on the musical message cannot be eliminated entirely.

SUMMARY OF THE INVENTION

It is an object of the present invention to provide a device for use in an audio signal processing system, designed to eliminate the aforementioned drawbacks, and which, at the same time, is straight forward and cheap to implement.

According to the present invention, there is provided a device for use in an audio signal processing system and comprising a vibration transmission circuit for controlled distribution of undesired vibration.

BRIEF DESCRIPTION OF THE DRAWINGS

A number of non-limiting embodiments of the present invention will be described by way of example with reference to the accompanying drawings, in which:

FIG. 1 shows a schematic view in perspective of a preferred embodiment of the device according to the present invention;

FIG. 2 shows a larger-scale front view, with parts removed for clarity, of the FIG. 1 device;

DETAILED DESCRIPTION OF THE INVENTION

Figure 3:
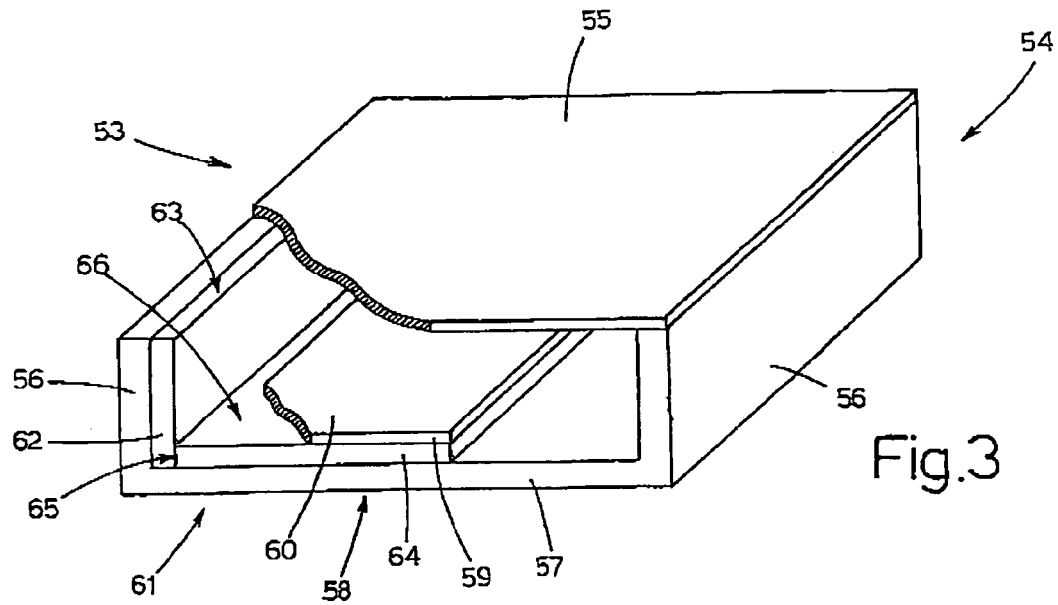
FIG. 3 shows a schematic view in perspective of a different embodiment of the device according to the present invention.

Number 1 in FIG. 1 indicates an audio signal processing device, in particular an optical disk (or so-called "CD") reader, which comprises an outer casing 2 having a horizontal top wall 3, two vertical lateral walls 4 (only one shown in FIG. 1), a horizontal bottom wall 5 (not shown in FIG. 1) with supporting feet 6, a vertical rear wall 7 (not shown in FIG. 1), and a vertical front wall 8 fitted with controls and indicators 9, and in which is formed a drawer 10 for housing a respective optical disk (not shown).

As shown in FIG. 2, which shows a front view of device 1 with front wall 8 removed, device 1 comprises a series of operating members 11, each for processing an audio signal, and in particular two electronic circuits 12, and an optical disk reading mechanism 13 comprising drawer 10. In an alternative embodiment not shown, optical disk reading mechanism 13 is replaced by a vinyl disk reading mechanism, by a magnetic disk reading mechanism, or by an analog or digital magnetic tape reading mechanism.

Device 1 also comprises a vibration transmission circuit 14 connected to operating members 11, and which provides for controlled distribution of undesired vibration in operating members 11. In a preferred embodiment, transmission circuit 14 comprises tuned harmonic materials normally used for making stringed musical instruments and defined by essences of wood, such fibers, such as kevlar or carbon fibers.

Harmonic materials, and in particular wood essences, can be divided into two types: harmonic essences, which are more transmissive and comprise, for example, cypress, fir, maple, yew, lime, poplar and beech; and hard essences, which comprise, for example, ebony, rosewood, cherry, boxwood, pear, olive and apple.

Transmission circuit 14 provides for controlled distribution and for discharge of undesired vibration, which can be compressed but not eliminated. Unlike conventional audio equipment, in which undesired vibration is compressed, transmission circuit 14 provides for channeling and discharging undesired vibration in regions where it cannot interfere with the audio signal.

Transmission circuit 14 comprises a vibration relief member 15 connected to, and for receiving undesired vibration from, operating members 11. Relief member 15 comprises a tuned soundbox 16 having a horizontal board 17 made of harmonic essence (preferably cypress or fir) and supporting operating members 11; and a C-shaped container 18 made of harmonic essence, preferably the same as board 17, and housing board 17 in floating manner so that board 17 is free to oscillate, with respect to container 18, about a central position in three perpendicular directions. In actual use, floating board 17 may be likened to the sounding board of a stringed musical instrument, and C-shaped container 18 to the soundbox.

The essence/s from which soundbox 16 is made is/are selected on the basis of known principles adopted in the making of stringed instruments, so that the parts of soundbox 16 are so tuned as to transmit vibration coherently and, hence, harmonically with no resonance (i.e. unnatural swelling of the musical message).

Board 17 and container 18 are connected by means of a series of known supports 19. In a preferred embodiment, a larger-scale view in perspective of which is shown in FIG. 2, each support 19 comprises an L-shaped bracket 20 fitted rigidly to an inner wall of container 18 and supporting, via the interposition of a ring 21 of highly yielding elastic material, a pin 22 connected rigidly to board 17.

Container 18 comprises a horizontal base board 23 defining horizontal bottom wall 5 of casing 2; and two vertical lateral walls 24 extending from opposite ends of, and defining a C shape with, base board 23. Boards 23 and 17 are parallel and respectively comprise a top surface 25 and a bottom surface 26 parallel to and facing each other. Lateral walls 24 are fitted with two surface treated wooden panels 27 defining lateral walls 4 of container 2.

Board 17 is connected acoustically to container 18 via the interposition, between board 17 and container 18, of at least one tuned transmission member 28, which transmits a particular range of frequencies and is positioned contacting bottom surface 26 of board 17 on one side, and top surface 25 of base board 23 on the opposite side. More specifically, the FIG. 2 embodiment has two transmission members 28, a first of which is defined by an acoustic tuning core 29 made of high-vibration-transmitting essence, in particular acoustic fir, and for transmitting relatively high frequencies (ultrasonic frequencies in the top part of the audio spectrum).

Acoustic core 29 is elongated in shape with a varying irregular section extending between a horizontal top base 30 contacting bottom surface 26 of board 17, and a horizontal bottom base 31 contacting top surface 25 of base board 23. The section of core 29 is generally 1–2 sq.cm, generally decreases upwards, and varies in size and shape, which are established as customary in the making of stringed instruments, according to the total weight to be supported by, and the transmission characteristics requested of, core 29.

In an alternative embodiment not shown, two or more cores 29 are used instead of a single relatively large core 29. Which solution is preferable in the case of a heavy board 17 (typically when optical disk reading mechanism 13 is replaced by a vinyl disk reading mechanism).

A second transmission member 28 transmits relatively low frequencies (subsonic frequencies in the bottom part of the audio spectrum) and comprises at least one intermediate body 32 made of hard essence and connected to bottom surface 26 of board 17 by first elastic members 33, and to top surface 25 of base board 23 by second elastic members 34.

In the FIG. 2 embodiment, second transmission member 28 comprises two intermediate bodies 32 located on opposite sides of container 18, and each normally resting against a respective lateral wall 24 and capable of oscillating in a horizontal direction parallel to board 23.

First elastic members 33 comprise four silicone rubber feet 35, each of which is connected to the bottom surface 26 of board 17, and rests on a top surface 36 of respective intermediate body 32; and second elastic members 34 comprise four rubber feet 37, each of which is connected to a bottom surface 38 of respective intermediate body 32, and rests on top surface 25 of board 23.

In an alternative embodiment not shown, a single intermediate body 32 is used, which is substantially the same size as board 23, has a respective hole for noncontacting passage of each core 29, and rests against lateral walls 24.

Container 18 also comprises a top panel 39 made of rigid material, and which is located over, and connected to, lateral walls 24, is parallel to base board 23, and defines top wall 3 of casing 2. Panel 39 also defines a top cover for a parallelepiped-shaped inner seat 40 of container 18 housing board 17 and corresponding operating members 11. Top panel 39 also closes the acoustic-harmonic circuit defining the path of the mechanical stress inside soundbox 16, and is preferably made of harmonic metal, typically copper.

To minimize the contact surface between panel 39 and lateral walls 24, panel 39 is fitted to lateral walls 24 by means of spacers 41 in which slide screws 42 (the heads of which are shown in FIG. 1). In alternative embodiments, spacers 41 may be made of plastic, metal or harmonic wood (preferably harmonic essence).

The load of the acoustic circuit of soundbox 16 is completed by a vertical rear panel 43 defining rear wall 7 of casing 2, and by a vertical front panel 44 defining front wall 8 of casing 2. Panels 43 and 44 are screwed to lateral walls 24 by respective series of screws 45, and are preferably, but not necessarily, made of harmonic metal, typically copper. In an alternative embodiment, panels 43 and 44 are made of aluminium, possibly butter finished on the outside for aesthetic reasons. In yet a further embodiment, panel 43 is made of aluminium, and panel 44 of copper.

As shown in FIG. 2, reading mechanism 13 comprises a frame 46 fitted directly to board 17 by respective screws (not shown); and each of electronic circuits 12 comprises a respective frame (or board) 47 also fitted directly to board 17 by respective screws (not shown). In a preferred embodiment, at least one core 48 of acoustic, high-vibration-transmitting essence, typically acoustic fir, is pressed on between board 17 and each frame 47 to facilitate transmission of vibration from respective electronic circuit 12 to board 17. Each core 48 has a top surface 49 contacting a bottom surface 50 of respective frame 47 with a predetermined pressure; and a bottom surface 51 contacting a top surface 52 of board 17 with said predetermined pressure.

Soundbox 16 is calibrated by adjusting the contact pressure between panels 39, 43, 44 and lateral walls 24 by means of screws 42 and 45.

In actual use, as opposed to being compressed (by means of damping devices), any undesired vibration generated or induced in operating members 11 is transmitted by circuit 14, which defines preferential paths (i.e. vibration channeling circuits) along which to transmit vibration to soundbox 16, where mechanical stationary stress and vibration is discharged, and all the dynamic energy sustaining them is dispersed in controlled manner. In other words, soundbox 16 acts as a vibration "trap" inside which spurious vibration energy is directed and dispersed to discharge any harmful mechanical stress gradually (and therefore in controlled manner) well away from the paths of the electroacoustic signal (or optical-electroacoustic signal in the case of a CD) before it can release any stationary energy capable of interfering with the audio signal being read.

For truly effective transmission-distribution inside the trap, to eliminate any noise induced by spurious vibration, the preferential vibration paths differ as to type, frequency and speed. For which reason, circuit 14 comprises a system tuned to the characteristic capacities of various materials to effectively and homogeneously transmit and distribute propagation of mechanical-acoustic spurious vibration stress.

Number 53 in FIG. 3 indicates an audio signal processing device, in particular an amplifier, which comprises a parallelepiped-shaped casing 54 having a metal horizontal top panel 55, two vertical lateral panels 56, and a horizontal bottom panel 57.

Casing 54 houses an operating member 58, in particular an electronic circuit 59 having a frame (or board) 60. Device 53 also comprises a vibration transmission circuit 61 connected to electronic circuit 59 to distribute any undesired vibration in electronic circuit 59 in controlled manner. Transmission circuit 61 comprises a vertical panel 62 made of harmonic material, in particular harmonic essence (preferably acoustic fir), and having a top surface 63 contacting metal panel 55; and a panel 64 made of harmonic material, in particular harmonic essence (preferably acoustic fir), and having a lateral surface 65 contacting panel 62, and a horizontal surface 66 contacting frame 60 of electronic circuit 59. More specifically, panel 64 is located beneath and supports frame 60.

In actual use, any undesired vibration in electronic circuit 59 is transmitted by panels 64 and 62 to metal top panel 55, which acts as a vibration relief means.

In the FIG. 4a embodiment, frame 60 is connected to, and kept separate from, panel 64 by means of screws 67; and cores 68 of harmonic essence may be pressed between frame 60 and panel 64 to facilitate vibration transmission.

In the FIG. 4b embodiment, panel 64 is positioned vertically and pressed between panel 62 and frame 60.

In the FIG. 4c embodiment, one panel 56 of casing 54 is made of harmonic material, in particular wood, and itself transmits vibration to metal panel 55 in place of panel 62; and panel 64 is connected to, and kept separate from, bottom panel 57 of casing 54 by means of a series of screws 69.

Figure 5:
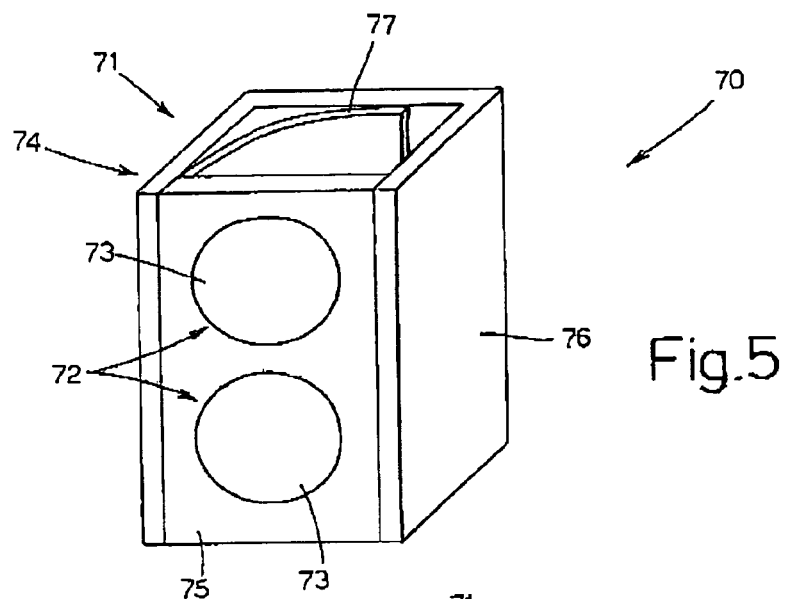
FIG. 5 shows a schematic view in perspective, with parts removed for clarity, of a further embodiment of the device according to the present invention.
Figure 6:
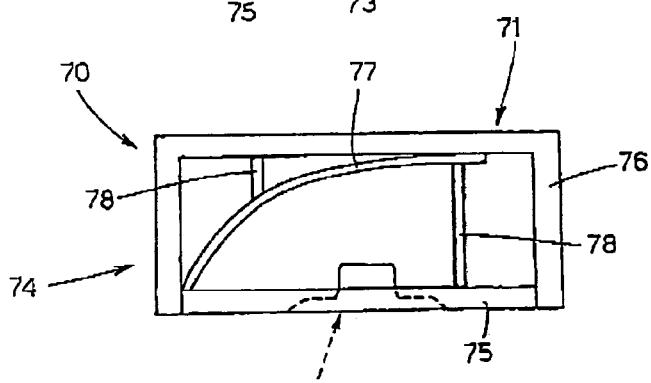
FIG. 6 shows a plan view of the FIG. 5 device.

Number 70 in FIGS. 5 and 6 indicates an audio signal processing device, in particular a loudspeaker, comprising a parallelepiped-shaped casing 71 (shown without the top panel in FIG. 5 for the sake of clarity) housing a pair of operating members 72, in particular a pair of acoustic transducers 73, each of which provides for converting an electric signal into a corresponding acoustic signal. In alternative embodiments not shown, acoustic transducers 73 are other than two in number (generally from one to five).

Device 70 also comprises a vibration transmission circuit 74 connected to acoustic transducers 73 to distribute any undesired vibration in acoustic transducers 73 in controlled manner. Transmission circuit 74 comprises a vertical panel 75 made of harmonic material, in particular harmonic essence (preferably acoustic fir), and supporting acoustic transducers 73; and a C-shaped member 76 housing panel 75 and made of harmonic material, in particular a hard or semihard essence. Member 76 and panel 75 together define a parallelepiped-shaped structure and the vertical lateral walls of casing 71.

Device 70 also comprises at least one shaped body 77 housed inside casing 71, between panel 75 and member 76, to define a labyrinth, and which, in a preferred embodiment, is made of harmonic material, in particular a hard essence. Shaped body 77 is connected acoustically to panel 75 and/or to member 76 via the interposition of at least one core 78 of harmonic essence.

In actual use, any undesired vibration in acoustic transducers 73 is transmitted by transmission circuit 74 to the outside air surrounding casing 71, which air acts in other words as a vibration relief means.

Figure 7:
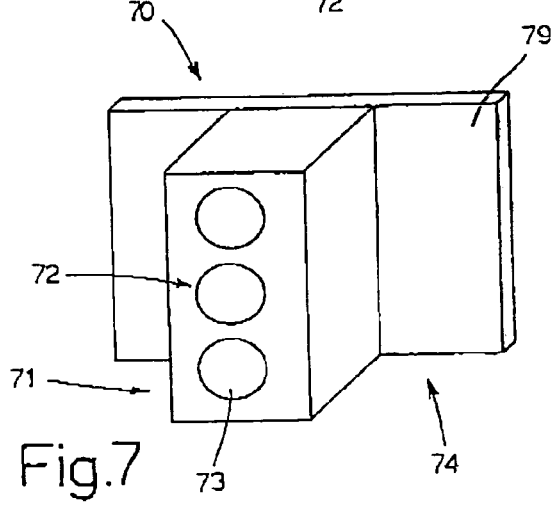
FIG. 7 shows a schematic view in perspective of a different embodiment of the FIG. 5 device.

In an alternative embodiment shown in FIG. 7, casing 71 is a known type, and transmission circuit 74 comprises a single panel 79 made of harmonic material, in particular harmonic essence (preferably acoustic fir), and connected to casing 71. Panel 79 and casing 71 are preferably connected maintaining panel 79 in contact with an outer surface of casing 71. In alternative embodiments not shown, transmission circuit 74 comprises a number of panels 79 connected to casing 71. Compared with the FIGS. 5 and 6 embodiment, the FIG. 7 embodiment provides for relatively modest vibration transmission, but, on the other hand, can also be used with known commercial loudspeakers with no substantial alterations required.

Figure 4:
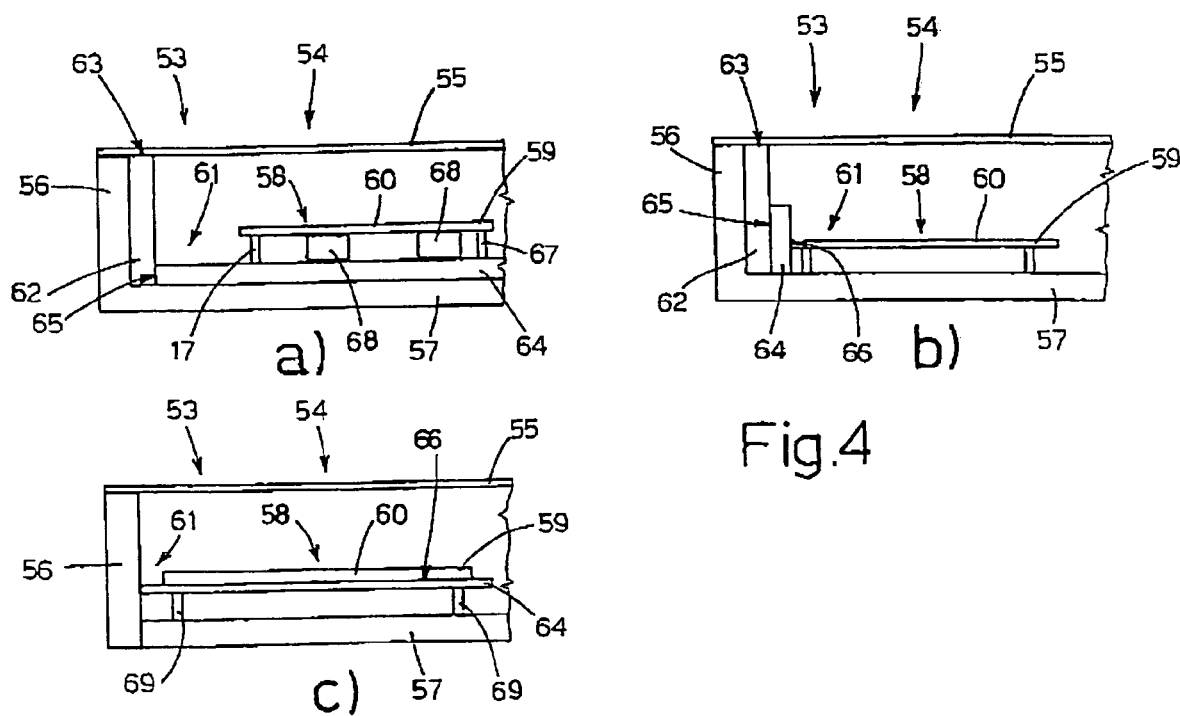
FIG. 4 shows front views, with parts removed for clarity, of variations of a detail in FIG. 3.

Any electronic circuits (not shown) in loudspeaker 70—typically, crossover circuits—are preferably fitted to panel 75, possibly with the interposition of cores of transmissive essence (in exactly the same way as in FIGS. 2, 3 and 4).

Figure 11:
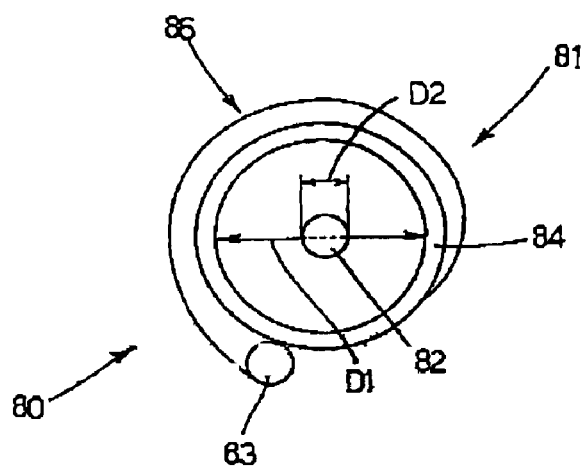
FIG. 11 shows a larger-scale section of the FIG. 10 device.
Figure 10:
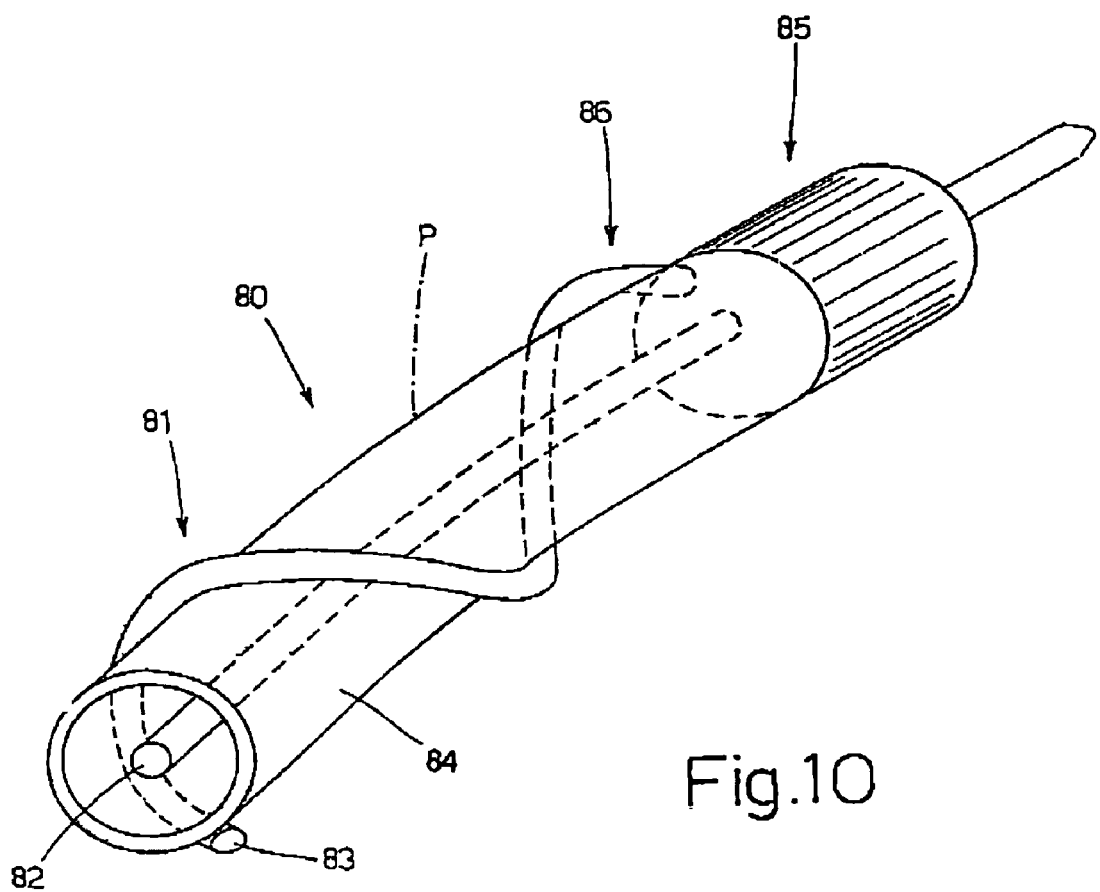
FIG. 10 shows a schematic view in perspective of a different embodiment of the device according to the present invention.

Number 80 in FIGS. 10 and 11 indicates an audio signal processing device, in particular a cable for transmitting an audio signal in the form of electric pulses by means of an operating member 81, in particular a pair of insulated conductors 82 and 83. Conductor 82 is housed inside a sheath 84 of insulating material, which defines a transmission path P and has an inside dimension D1 greater than an outside dimension D2 of conductor 82; and conductor 83 is coiled about sheath 84. Cable 80 also comprises two connectors 85 (only one shown in FIG. 10) at the two opposite ends of cable 80; conductors 82, 83 and sheath 84 are connected mechanically to each connector 85; and each portion of conductor 82 is obviously free to move inside sheath 84 in a direction perpendicular to path P.

Sheath 84 defines a vibration transmission circuit 86 by permitting conductor 82 to vibrate and so transmit any undesired internal vibration to the air inside sheath 84.

In a preferred embodiment, conductor 82 is connected to a positive of the electric signal, and conductor 83 to a negative (or ground) of the electric signal.

In a further embodiment not shown, cable 80 comprises a further conductor coiled about a further sheath of insulating material housing conductors 82 and 83.

In a further embodiment not shown, a cable identical with the one in FIGS. 10 and 11 may be used for supplying electrical power to an audio apparatus, e.g. of the type shown in FIGS. 1 and 3. In which case, connectors 85 are replaced by equivalent connectors insertable inside electric power sockets, and the outer insulation of conductors 82 and 83 is changed. Inner conductor 82 is preferably connected to a positive (or phase), and outer conductor 83 to a negative (or neutral, or ground).

Figure 8:
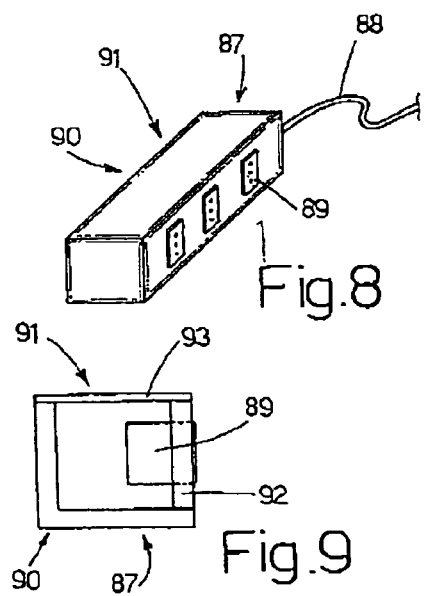
FIG. 8 shows a schematic view in perspective of a further embodiment of the device according to the present invention.
Figure 9:
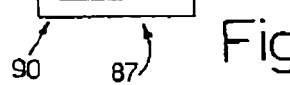
FIG. 9 shows a section of the FIG. 8 device.

Number 87 in FIGS. 8 and 9 indicates an audio apparatus supply device, in particular a multiple outlet having a supply cable 88 and a number of outlets 89. Multiple outlet 87 comprises a casing 90 housing outlets 89; and a vibration transmission circuit 91, in turn comprising a panel 92, which is made of harmonic material, in particular harmonic essence, supports outlets 89, and is connected to a metal panel 93 acting as a vibration relief member. Panels 92 and 93 preferably define outer walls of casing 90.

What is claimed is:

1. A device (1; 53; 70; 80; 87) for use in an audio signal processing system and comprising at least one operating member (11; 58; 72; 81) for processing an audio signal; and a vibration transmission circuit (14; 61; 74; 86; 91), which in turn comprises harmonic materials acoustically tuned to one another, and is connected to said operating member (11; 58; 72; 81) to distribute undesired vibration in controlled manner; wherein said transmission circuit (14; 61; 74; 86) comprises vibration relief means (15; 55; 76) connected to said operating member (11; 58; 72; 81) to receive said undesired vibration from the operating member (11; 58; 72; 81); and wherein said relief means (15; 55; 76) comprise a tuned soundbox (16).

2. A device as claimed in claim 1, wherein said transmission circuit (14; 61; 74; 86; 91) comprises at least one chain of harmonic materials connected acoustically to one another to transmit said vibration.

3. A device as claimed in claim 1, wherein said soundbox (16) comprises a supporting board (17) made of harmonic material and supporting the operating member (11; 58; 72; 81); and a container (18) housing said supporting board (17) in floating manner.

4. A device as claimed in claim 3, wherein said supporting board (17) is mounted in floating manner so as to be free to oscillate, about a central position of its own, in three perpendicular directions and with respect to said container (18).

5. A device as claimed in claim 3, wherein said supporting board (17) is connected acoustically to said container (18) via the interposition, between the supporting board (17) and the container (18), of at least one tuned transmission member (28) for transmitting a particular range of frequencies.

6. A device as claimed in claim 3, wherein said container (18) comprises at least one horizontal base board (23), and two vertical lateral walls (24) extending from opposite ends of the base board (23); the base board (23) and the lateral walls (24) together defining a C shape; and said supporting board (17) being a horizontal board parallel to the base board (23) and located between said lateral walls, and having a bottom surface (26) facing a top surface (25) of said base board (23).

7. A device as claimed in claim 6, wherein said supporting board (17) is connected acoustically to said container (18) via the interposition, between the supporting board (17) and the container (18), of two tuned transmission members (28), each of which transmits a particular range of frequencies and is positioned contacting said bottom surface (26) of said supporting board (17) on one side, and contacting said top surface (25) of said base board (23) on the opposite side.

8. A device as claimed in claim 7, wherein a first of said two transmission members (28) comprises at least one acoustic tuning core (29) made of a highly vibration-transmitting essence.

9. A device as claimed in claim 6, wherein a second of said two transmission members (28) comprises at least one intermediate body (32) made of a hard essence; said intermediate body (32) being connected to the bottom surface (26) of said supporting board (17) by means of first elastic members (33), and being connected to the top surface (25) of said base board (23) by means of second elastic members (34).

10. A device as claimed in claim 9, wherein said intermediate body (32) normally rests on said lateral walls (24), and is capable of oscillating in a horizontal direction parallel to said supporting board (17).

11. A device as claimed in claim 9, wherein said second transmission member (28) comprises a pair of intermediate bodies (32) on opposite sides of said container (18).

12. A device as claimed in claim 9, wherein said first elastic members (33) comprise four silicone rubber feet (35); and said second elastic members (34) comprise four rubber feet (37).

13. A device as claimed in claim 12, wherein said intermediate body (32) has a top surface (36) facing the bottom surface (26) of said supporting board (17), and a bottom surface (38) facing the top surface (25) of said base board (23); said first elastic members (33) being connected to the bottom surface (26) of said supporting board (17), and resting on the top surface (36) of said intermediate body; and said second elastic members (34) being connected to the bottom surface (38) of said intermediate body, and resting on the top surface (25) of said base board (23).

14. A device as claimed in claim 12, wherein said container (18) comprises a top panel (39) made of rigid material, located over and connected to said lateral walls, and parallel to said base board (23); said top panel (39) defining a top cover of a parallelepiped-shaped inner seat (40) of said container (18); and said supporting board (17) being housed inside said seat (40).

15. A device as claimed in claim 14, wherein said top panel (39) is made of a harmonic metal.

16. A device as claimed in claim 14, wherein said container (18) comprises a front panel (44) and a rear panel (43), which are made of metal material and are positioned vertically and perpendicular to said lateral walls (24) to close said seat (40).

17. A device as claimed in claim 3, wherein said operating member (1; 58; 72; 81) is defined by an audio source reading mechanism (13); said mechanism (13) having a frame (46) fitted directly to said supporting board (17).

18. A device as claimed in claim 3, wherein said operating member (11; 58; 72; 81) is defined by an electronic circuit (12); said electronic circuit (12) having a frame (47) fitted directly to said supporting board (17); and at least one core (48) of highly vibration-transmitting acoustic essence being interposed between said frame (47) and said supporting board (17).

19. A device as claimed in claim 3, comprising at least two said operating members (11), each of which has a respective frame (46, 47) fitted directly to said supporting board (17); a first of said two operating members (11) being defined by an audio source reading mechanism (13); a second of said two operating members (11) being defined by an electronic circuit (12);

ard at least one core (48) of highly vibration-transmitting acoustic essence being interposed between the frame (47) of said second operating member (11) and said supporting board (17).

* * * * *